US010020047B2

(12) United States Patent
Hunt-Schroeder et al.

(10) Patent No.: US 10,020,047 B2
(45) Date of Patent: Jul. 10, 2018

(54) STATIC RANDOM ACCESS MEMORY (SRAM) WRITE ASSIST CIRCUIT WITH IMPROVED BOOST

(71) Applicant: GLOBALFOUNDRIES INC., Grand Cayman (KY)

(72) Inventors: Eric D. Hunt-Schroeder, South Burlington, VT (US); John A. Fifield, Underhill, VT (US); Mark D. Jacunski, Colchester, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/076,139

(22) Filed: Mar. 21, 2016

(65) Prior Publication Data

US 2017/0270999 A1 Sep. 21, 2017

(51) Int. Cl.
G11C 11/00 (2006.01)
G11C 11/419 (2006.01)
G11C 5/14 (2006.01)
G11C 7/12 (2006.01)
G11C 11/417 (2006.01)

(52) U.S. Cl.
CPC .......... G11C 11/419 (2013.01); G11C 5/145 (2013.01); G11C 7/12 (2013.01); G11C 11/417 (2013.01)

(58) Field of Classification Search
CPC ....... G11C 11/419; G11C 11/417; G11C 7/12; G11C 5/145
See application file for complete search history.

(56) References Cited

U.S. PATENT DOCUMENTS

| 8,363,453 | B2 | 1/2013 | Arsovski et al. | |
|---|---|---|---|---|
| 8,411,518 | B2 | 4/2013 | Janardan et al. | |
| 9,508,420 | B1* | 11/2016 | Hunt-Schroeder | ... G11C 11/419 |
| 9,570,156 | B1* | 2/2017 | Braceras | ............... G11C 11/419 |
| 2009/0235171 | A1* | 9/2009 | Adams | ................. G11C 7/1096 715/723 |
| 2012/0163110 | A1* | 6/2012 | Sinha | ..................... G11C 7/227 365/203 |
| 2012/0170391 | A1* | 7/2012 | Janardan | .................. G11C 7/04 365/194 |
| 2015/0146479 | A1* | 5/2015 | Pilo | ........................ G11C 11/419 365/156 |
| 2016/0203857 | A1* | 7/2016 | Chandra | ............... G11C 11/419 365/156 |

* cited by examiner

*Primary Examiner* — Kretelia Graham
(74) *Attorney, Agent, or Firm* — Anthony Canale; Andrew M. Calderon; Roberts Mlotkowski Safran Cole & Calderon, P.C.

(57) ABSTRACT

Approaches for a write assist circuit are provided. The write assist circuit includes a boost capacitor with a first node coupled to a bitline through control logic and a second node connected to a field effect transistor (FET) diode stack, a plurality of boot enabled transistors which each contain a gate connected to a boost control signal, and a controlled current source coupled between a ground signal and the second node of the boost capacitor. In the write assist circuit, the boost capacitor has a discharge path which is controlled to provide a boost voltage which is invariant to a level of a power supply signal.

9 Claims, 5 Drawing Sheets

STATIC RANDOM ACCESS MEMORY (SRAM) WRITE ASSIST CIRCUIT WITH IMPROVED BOOST

BACKGROUND

The invention relates to a static random access memory (SRAM) write assist circuit with improved boost, and more particularly, to a SRAM write assist circuit with a near constant improved boost.

Memory devices are commonly employed as internal storage areas in a computer or other electronic equipment. One specific type of memory used to store data in a computer is random access memory (RAM). RAM is typically used as main memory in a computer environment, and is generally volatile in that once power is turned off, all data stored in the RAM is lost.

A static RAM (SRAM) is one example of a RAM. An SRAM has the advantage of holding data without a need for refreshing. A typical SRAM device includes an array of individual SRAM cells. Each SRAM cell is capable of storing a binary voltage value that represents a logical data bit (e.g., "0" or "1"). One existing configuration for an SRAM cell includes a pair of cross-coupled devices such as inverters. The inverters act as a latch that stores the data bit therein, so long as power is supplied to the memory array. In a conventional six-transistor (6 T) cell, a pair of access transistors or pass gates (when activated by a word line) selectively couples the inverters to a pair of complementary bit lines (i.e., a bit line true and bit line complementary). Other SRAM call designs may include a different number of transistors (e.g., 4 T, 8 T, etc.).

The design of SRAM cells has traditionally involved a compromise between the read and write functions of the memory array to maintain cell stability, read performance and write performance. In particular, the transistors which make up the cross-coupled latch must be weak enough to be over-driven during a write operation, while also strong enough to maintain their data value when driving a bit line during a read operation. The access transistors that connect the cross-coupled inverters to the true and complement bit lines affect both the stability and performance of the cell. In one-port SRAM cells, a single pair of access transistors are conventionally used for both read and write access to the cell. The gates are driven to a digital value in order to switch the transistors between an "on" and "off" state. The optimization of an access for a write operation would drive the reduction of the on-resistance ($R_{on}$) for the device. On the other hand, the optimization of an access transistor for a read operation drives an increase in $R_{on}$ in order to isolate the cell from the bit line capacitance and prevents a cell disturbance.

This compromise between the read function and the write function for an SRAM becomes more of an issue as integrated circuits are scaled down in size. In particular, read and write margins of the SRAM cells, which measure how reliably the bits of the SRAM cells can be read from and written into, are reduced as the operation voltages of the integrated circuits are reduced with the down-scaling of the circuits. Reduced read and write margins may consequently cause errors in the respective read and write operations for the SRAM cells. Further, the transistors which make up the cross-coupled latch must be weak enough to be over-driven during a write operation, while also strong enough to maintain their data value while driving a bit line during a read operation.

SUMMARY

In a first aspect of the invention, there is a write assist circuit which includes a boost capacitor with a first node coupled to a bitline through control logic and a second node connected to a field effect transistor (FET) diode stack, a plurality of boost enabled transistors which each contain a gate connected to a boost control signal, and a controlled current source coupled between a ground signal and the second node of the boost capacitor. In the write assist circuit, the boost capacitor has a discharge path which is controlled to provide a boost voltage which is invariant to a level of a power supply signal.

In another aspect of the invention, there is a digital to analog converter (DAC) for creating a reference current source. The DAC includes a resistor coupled between a power supply signal and at least one binary weighted diode configured transistor, and the at least one binary weighted diode configured transistor is coupled between the resistor and a ground signal, and receives at least one input control signal for creating the reference current source. In the DAC, the at least one binary weighted diode configured transistors operate in a saturation region.

In another aspect of the invention, there is a method which includes charging a boost capacitor through a power supply signal based on a level of a boost control signal and discharging the boost capacitor to provide a boost voltage at a level less than a ground signal. In the method, the boost voltage is invariant to the level of the power supply signal.

DETAILED DESCRIPTION

Figure 1:
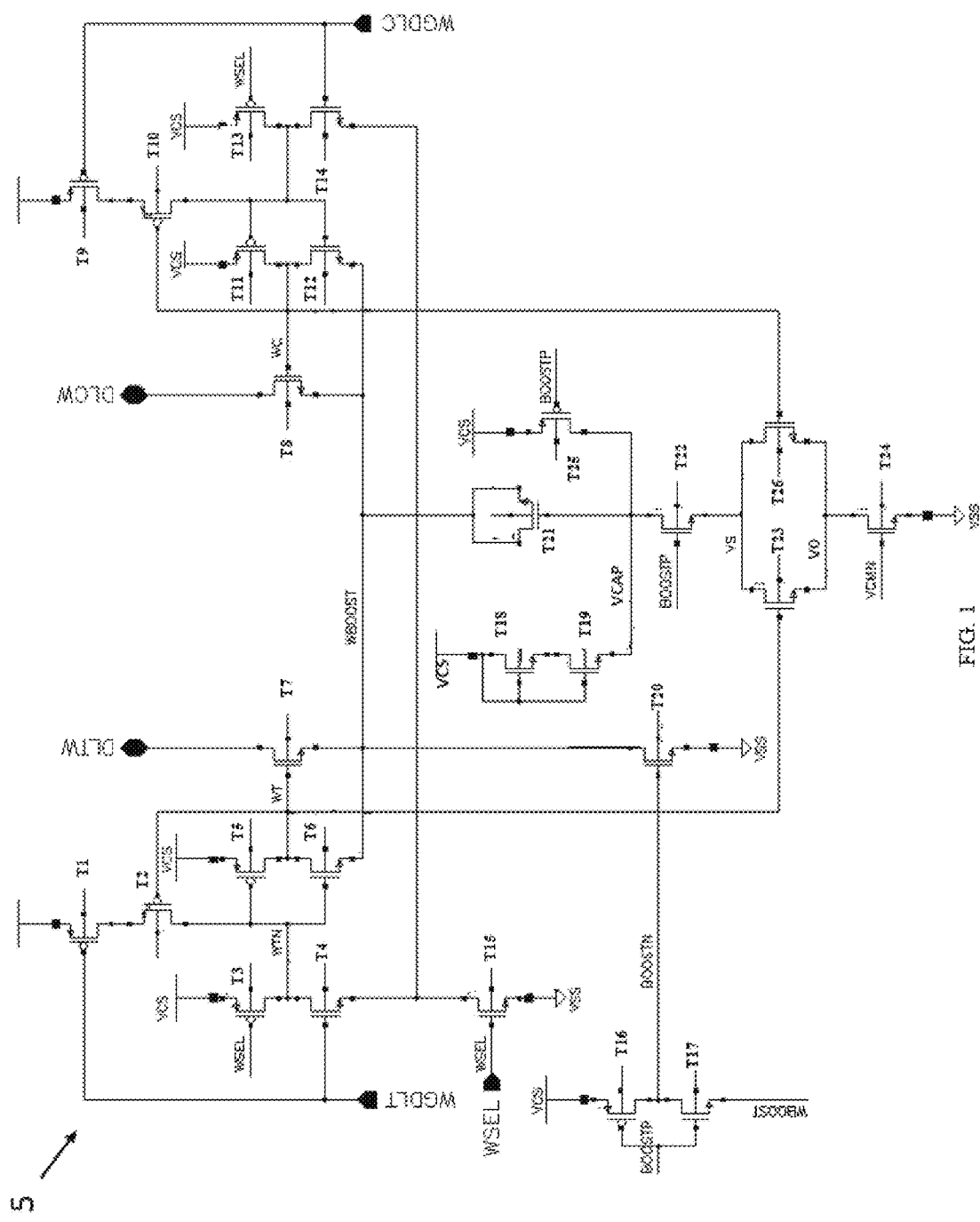
FIG. 1 shows a schematic view of a write assist circuit in accordance with aspects of the invention.

The invention relates to a static random access memory (SRAM) write assist circuit with improved boost, and more particularly, to an SRAM write assist circuit with a near constant improved boost. In particular, the invention introduces a simple reference current source from one or more binary weighted settings to provide a near constant boost across process, voltage, and temperature (PVT). The invention also can use one simple reference current source to service multiple write drivers. The invention allows for tuning and boosting magnitudes to desired levels to lock in near constant boost.

A circuit may provide a single boost from a single capacitor. In such a system, the single boost of the circuit is dependent on relative timings of two write selection signals WSEL<1> and WSEL<0>. This single boost of the circuit brings a bit line below ground (i.e., negative boost level) based on an amount of charge stored on a single capacitor which then decays to ground. However, this approach is problematic because stress issues may occur and managing negative boost levels is very difficult. Further, such an approach may require greater circuit complexity and consume more power due to the boost rising rapidly as the supply voltage increases.

Once the boost level decays to approximately −80 mV, there is little write assist provided at low voltages where significant boost is still required. Although this boost technique may work well in older technologies (e.g., 32 nm technology), in newer technologies (e.g., 14 nm technology and beyond), an increased variability requires careful attention and managing of boost at high VCS (e.g., >800 mV) for reliability.

In embodiments, a near constant boost may be provided across process, voltage, and temperature, which is in contrast to a write assist circuit which attenuates and discards charge as the power supply voltage is increased and which makes it extremely difficult to tune the boost across process and temperature. In embodiments, a reliable write assist system is provided which can be tuned to provide a predetermined boost magnitude. Further, in embodiments, the selected boost magnitude remains nearly constant across process and temperature to meet writeability of 5.8 sigma. Thus, in embodiments, power requirements (i.e., power levels) of the near constant boost are reduced in comparison to known systems. Further, in embodiments, circuit complexity of the write assist circuit is reduced.

In embodiments, an n-type metal-oxide semiconductor field-effect transistor (NFET) diode and a current source (e.g., a VCMN signal) is added to an SRAM write assist circuit to provide near constant boost across process, voltage, and temperature. More specifically, the near constant boost voltage is generated by two NMOS devices in a diode configuration being pulled on by a current source. The current source in the embodiments also features some amount of current trim, to provide a slight adjustment range for the boost. The near constant boost across the process, voltage, and temperature occurs regardless of the supply voltage. The near constant boost voltage occurs as a result of charging a boost capacitor and discharging it a controlled amount.

In embodiments, an SRAM bitline boost control-circuit is comprised of a boost capacitor with a charging path to a power supply and a discharge path controlled to provide a boost voltage which is essentially invariant to the power supply level. The boost capacitor has a first node coupled to a bitline through control logic and a second node connected to a FET diode stack to the power supply, and to a controlled current source to ground such that discharge of the second node is limited to an FET threshold plus overdrive. Therefore, the discharge of the boost capacitor provides a boost voltage at a level lower than a ground signal. Further, the discharge of the boost capacitor is based on a controlled current source which tracks the threshold voltage of the FET diodes. In embodiments, the discharge path includes series connected boost enable switches and write mask switches to allow selection of a bitline to be boosted. The controlled current source is an element of a current mirror which contains a plurality of reference diodes which can be enabled or disabled by a digital control to adjust the controlled current level.

FIG. 1 shows a schematic view of a write assist circuit in accordance with aspects of the invention. By way of an example, the write assist circuit 5 of FIG. 1 may be an SRAM write assist circuit. In particular, the write assist circuit 5 shows a plurality of transistors T1-T26 in additional to several signal lines. The signal lines include: a true data line write signal DLTW, a true data line complement write signal DLCW, a write selection signal WSEL, a first control signal BOOSTP, a boost signal WBOOST, a negative boost signal BOOSTN, a current-mirror signal VCMN, a true write line signal WGDLT, a true write line complement signal WGDLC, a first voltage signal VCS, a second voltage signal VSS, a second control signal WT, a negative second control signal WTN, a third control signal WC, a first voltage node VS, a second voltage node VCAP, and a third voltage node V0. The second voltage node VCAP is a controlled voltage below the first voltage signal VCS. In addition, the write assist circuit of FIG. 1 includes a plurality of PFET transistors (e.g., T1, T2, T3, T5, T9, T10, T11, T13, T16, and T25) and a plurality of NFET transistors (e.g., T4, T6, T7, T8, T12, T14, T15, T17, T18, T19, T20, T21, T22, T23, T24, and T26).

As shown in FIG. 1, in the write assist circuit 5, a transistor T1 has a gate connected to the true write line signal WGDLT, a source connected to a power supply voltage, and a drain connected to a source of a transistor T2. The transistor T2 has a gate connected to the second control signal WT and a drain connected to a gate of a transistor T5. The transistor T3 has a gate connected to the write selection signal WSEL, a source connected to the first voltage signal VCS, and a drain connected to a drain of the transistor T4. The transistor T4 has a gate connected to the true write line signal WGDLT and a source connected to a drain of a transistor T15. The transistor T5 has a source connected to the first voltage signal VCS and the drain connected to a drain of a transistor T6. The transistor T6 has a gate connected to the drain of transistor T2 and a source connected to the boost signal WBOOST. The transistor T7 has a drain connected to the true data line write signal DLTW, a gate connected to the second control signal WT, and a source connected to the boost signal WBOOST.

As shown in FIG. 1, in the write assist circuit 5, a transistor T8 has a gate connected to the third control signal WC, a drain connected to the data line complement write signal DLCW, and a source connected to the boost signal WBOOST. The transistor T9 has a source connected to the first voltage signal VCS, a gate connected to the write line complement signal WGDLC, and a drain connected to a source of a transistor T10. The transistor T10 has a gate connected to the third control signal WC and a drain connected to a gate of a transistor T11. The transistor T11 has a source connected to the first voltage signal VCS and a drain connected to a drain of the transistor T12. The transistor T12 has a gate connected to the gate of the transistor T11 and a source connected to the boost signal WBOOST. The transistor T13 has a gate connected to the write selection signal WSEL, a source connected to the first voltage signal VCS, and a drain connected to a drain of the transistor T14. The transistor T14 has a gate connected to the write line complement signal WGDLC and a source connected to the drain of the transistor T15.

As further shown in FIG. 1, in the write assist circuit 5, the transistor T15 has a gate connected to the write selection signal WSEL and a source connected to the second voltage signal VSS. The transistor T16 has a source connected to the first voltage signal VCS, a gate connected to the first control signal BOOSTP, and a drain connected to the negative boost signal BOOSTN. The transistor T17 has a drain connected to the negative boost signal BOOSTN, a gate connected to the first control signal BOOSTP, and a source connected to the boost signal WBOOST. The transistor T18 has a drain connected to the first voltage signal VCS, a gate connected to the first voltage signal VCS, and a source connected to a drain of the transistor T19. The transistor T19 has a gate connected to the first voltage signal VCS and a source connected to the second voltage node VCAP. The transistor T20 has a gate connected to the negative boost signal BOOSTN, a drain connected to the boost signal WBOOST, and a source connected to the second voltage signal VSS.

The transistor T18 and the transistor T19 form an FET diode stack. As both the transistor T18 and the transistor T19 are NFETs, the FET diode stack keeps the boost voltage within a threshold drop plus a small amount of overdrive of the first voltage signal VCS (or any other supply voltage) and prevents the boost voltage from dropping to the ground signal.

As further shown in FIG. 1, in the write assist circuit 5, the transistor T21 has a gate connected to the second voltage node VCAP and both a drain and a source connected to the boost signal WBOOST. The transistor T22 has a gate connected to the first control signal BOOSTP, a drain connected to the second voltage node VCAP, and a source connected to the first voltage node VS. The T23 has a gate connected to the second control signal WT, a drain connected to the first voltage node VS, and a source connected to the third voltage node V0. The transistor T24 has a drain connected to the third voltage node V0, a gate connected to the signal VCMN, and a source connected to the second voltage signal VSS. The transistor T25 has a gate connected to first control signal BOOSTP, a source connected to the first voltage signal VCS, and a drain connected to the second voltage node VCAP. The T26 has a gate connected to the third control signal WC, a source connected to the third voltage node V0, and a drain connected to the first voltage node VS.

In FIG. 1, the transistor T21 acts as a boost capacitor. The transistor T21 is coupled between a bitline (e.g., the boost signal WBOOST) and the FET diode stack (e.g., transistor T18 and transistor T19 configured as a diode stack) through another node (e.g., the second voltage node VCAP). Further, transistor T21 is coupled to a controlled current source (e.g., the signal VCMN) to ground (e.g., the second voltage signal VSS). Therefore, discharge of the gate node of T21 (e.g., the second voltage node VCAP) is limited to a threshold of an FET plus an overdrive amount. In an embodiment, the threshold of the FET plus the overdrive amount may be approximately 200 mV.

In an embodiment, the transistor T21 may have an alternate configuration (not shown in FIG. 1). For example, the transistor 21 could act as a boost capacitor in a PFET configuration (as opposed to the NFET configuration shown in FIG. 1). In this alternate configuration, both the drain and the source of the transistor T21 would be connected to the second voltage node VCAP. Further, in this alternate configuration, the gate of the transistor T21 would be connected to the boost signal BOOST.

In FIG. 1, transistor T21 has a discharge path which is controlled to provide a boost voltage which is essentially invariant to the power supply level. Further, the discharge path includes series connected boost enabled switches/transistors (e.g., transistors T16, T17, T22, and T25) and write mask switches/transistors (e.g., transistors T23 and T26) to allow selection of the bitline to be boosted. In addition, the controlled current source (e.g., the signal VCMN) is an element of a current mirror containing a plurality of reference diodes which can be enabled or disabled by a digital control to adjust the controlled current level.

Figure 2:
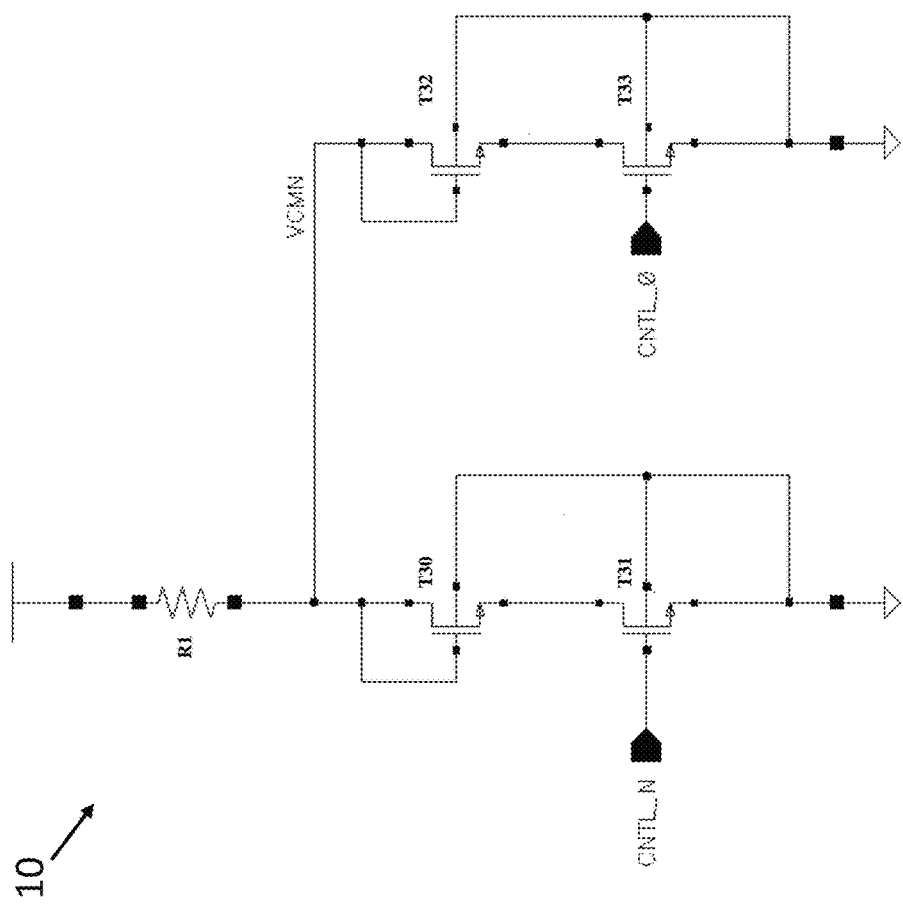
FIG. 2 shows a schematic view of a digital to analog converter for creating a reference current source in accordance with aspects of the invention.

FIG. 2 shows a schematic view of a digital to analog converter 10 for creating a reference controlled current source (e.g., the signal VCMN in FIG. 1) in accordance with aspects of the invention. In FIG. 2, the reference current source may be created using a single resistor connected to a power supply and also connected to one or more binary weighted diode configured transistors which operate in a saturation region. The one or more binary weighted diode configured transistors can be programmed by one or more direct current (DC) control signals to affect a level of the reference controlled current source (e.g., the signal VCMN in FIG. 1). An example of the one or more binary weighted diode configured transistors is T30 and T31, which act as a diode and obtain a fraction of the total current (e.g., a binary weighted current). In particular, FIG. 2 shows a resistor R1, in series with a plurality of serially positioned transistors T30 and T31 and parallel to serially positioned transistors T32 and T33, and control inputs CNTL_0 to CNTL_N.

In embodiments, the reference controlled current source (e.g., the signal VCMN in FIG. 1) is created from one or more binary weighted diode configured transistors (e.g., T30, T31 or T32, T33) that are enabled with one or more direct current (DC) control signals. Using one or more DC control signals, the VCMN voltage can be changed by one or more binary weighted diode configured transistors. The one or more binary weighted diode configured transistors change the reference current and ratio of currents from the reference to mirror current. If more or less boost is required as VCS varies from Vmin to Vmax, embodiments described herein enable one or more binary weighted boost levels which remain near constant across VCS. This enables an SRAM design to achieve write sigma targets and stay within reliability constraints all with simple DC control signals.

Although FIG. 2 only shows two binary weighted current sources (e.g., a first binary weighted current source comprising transistors T30 and T31 and a second binary weighted current source comprising transistors T32 and T33), one of ordinary skill in the art would understand that any number of binary weighted current sources may be implemented in the present invention. In fact, control input CNTL_N in FIG. 2 can represent a control input of the Nth binary weighted current source, where N is any whole number which is greater than or equal to one. In embodiments, the number of binary weighted current sources in FIG. 2 can be adjusted to tune the boost voltage level according to the boost requirements of the SRAM write assist circuit in FIG. 1.

In FIG. 2, the digital to analog converter (DAC) 10 uses a binary weighted current source (e.g., a first binary weighted current source comprising transistors T30 and T31) to mirror a reference current over to one or more write assist circuits. Thus, the signal VCMN is created from the reference current source and the current mirror (e.g., Imirror) connected to VCMN generates a known ratio of currents. Imirror may be calculated as (x divided by y) multiplied by Tref, where x and y represent beta ratios of the transistors in the current mirror (e.g., betas of transistors T30 and T31). Tref is the reference current source, which is a function of the power supply voltage.

In FIG. 2, the more binary current weighted current sources that are provided and used, the less current that is provided through the signal VCMN and the less voltage that occurs at the VCMN signal. Thus, the boost voltage level (e.g., level of the boost signal WBOOST) in FIG. 1 will be lowered. In other words, the signal VCMN will control how much we discharge the boost capacitor (e.g., transistor T21) and therefore how much boost (e.g., the boost signal WBOOST) will be provided.

Figure 3:
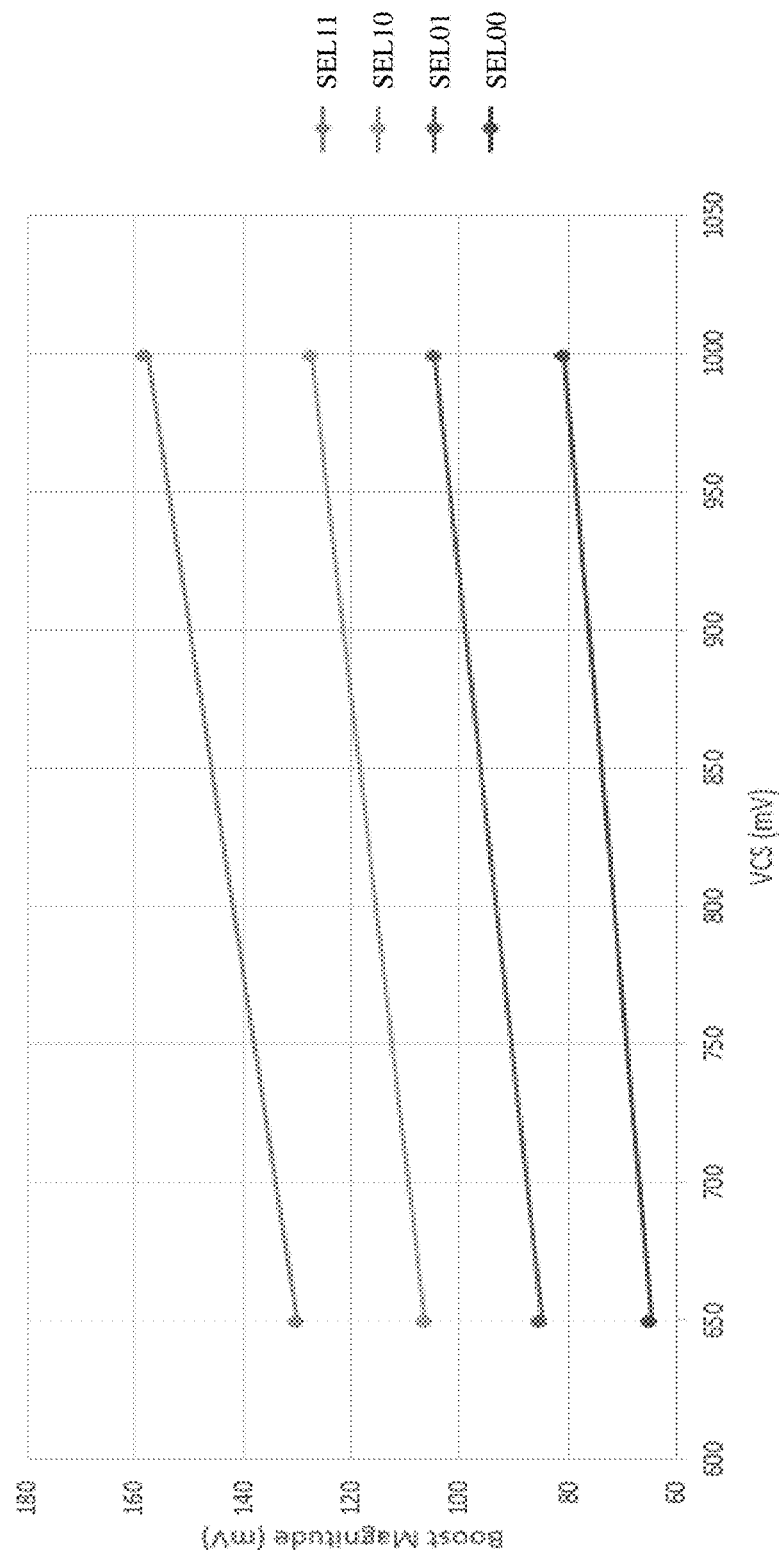
FIG. 3 shows a graph of a boost magnitude with binary weighted control in accordance with aspects of the invention.

FIG. 3 shows a graph of a boost magnitude with binary weighted control in accordance with aspects of the invention. In particular, FIG. 3 shows the boost magnitude that can be obtained based on the circuits in FIGS. 1 and 2. In FIG. 3, the y-axis represents a boost magnitude in millivolts and the x-axis represents a supply voltage VCS level in millivolts. In FIG. 3, using one or more control inputs CNTL_0 to CNTL_N of FIG. 2, which correspond to SEL11, SEL10, SEL01, and SEL00 (i.e., selections using two control bits), the boost magnitude can be changed across VCS. For example, as shown in FIG. 3, using SEL00, the boost magnitude (in mV) ranges from approximately 63 mV at a VCS level of 650 mV to approximately 80 mV at a VCS of 1000 mV. Therefore, in contrast to the related art, the boost magnitude remains relatively constant (within a range of 63 mV to 80 mV, or invariant) across a wide range of VCS level (650 mV to 1000 mV).

In FIG. 3, using SEL01, SEL10, and SEL11, similar boost magnitude ranges occur across a wide range of VCS (650 mV to 1000 mV). Further, if more boost is required at high VCS (i.e., >800 mV), the circuits described herein enable an increase of a slope (e.g., SEL11 in FIG. 3) of a boost magnitude or provide a near constant boost across VCS (e.g., SEL00 in FIG. 3). In contrast, in the related art, the boost magnitude has a much greater variability across the wide range of VCS.

Figure 4:
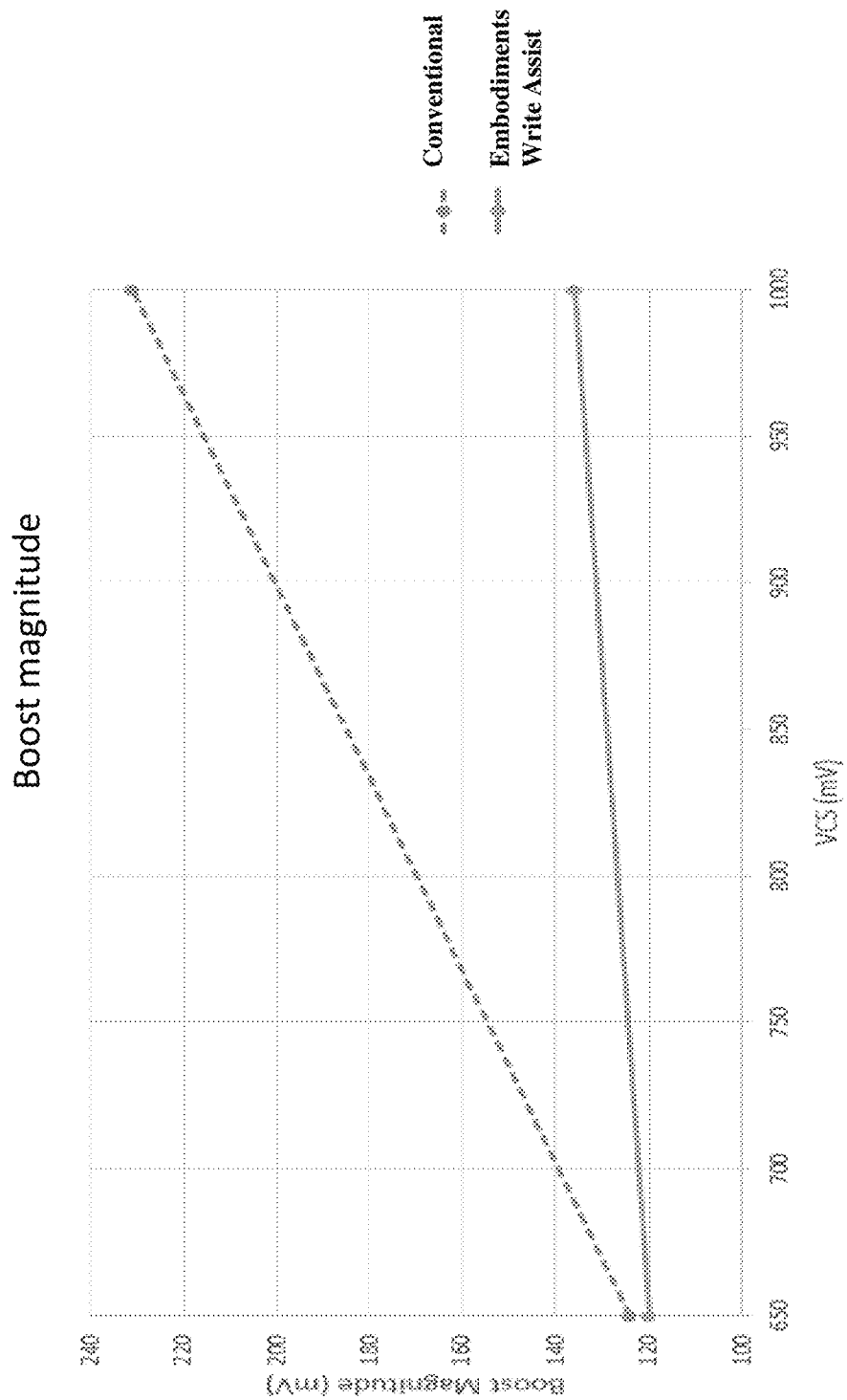
FIG. 4 shows a comparison graph of a boost magnitude using a conventional circuit and a circuit in accordance with aspects of the invention.

FIG. 4 shows a comparison graph of a boost magnitude using a conventional circuit and a circuit in accordance with aspects of the invention. In FIG. 4, the y-axis represents a boost magnitude in millivolts and the x-axis represents a VCS level in millivolts. In FIG. 4, the dashed line represents a conventional write assist, where the boost magnitude is a maximum (e.g., 230 mV) at a 1000 mV VCS level. However, as the VCS level drops, the boost magnitude drops substantially, which results in the boost magnitude being approximately 122 mV at 650 mV VCS level. Also, as the VCS level increases from 650 mV to 1000 mV, the increase in boost magnitude is approximately 108 mV.

In contrast, in FIG. 4, the solid line representing the write assist circuit of the present invention (i.e., the boost magnitude that can be obtained based on the circuits in FIGS. 1 and 2) shows that a boost magnitude is relatively constant (ranges from approximately 120 mV to approximately 138 mV) within a range of 650 mV to 1000 mV VCS level. Therefore, in embodiments, the boost magnitude remains relatively constant (i.e., invariant) across a wide range of VCS levels. In embodiments, as the VCS level increases from 650 mV to 1000 mV, the increase in boost magnitude is approximately 18 mV.

Figure 5:
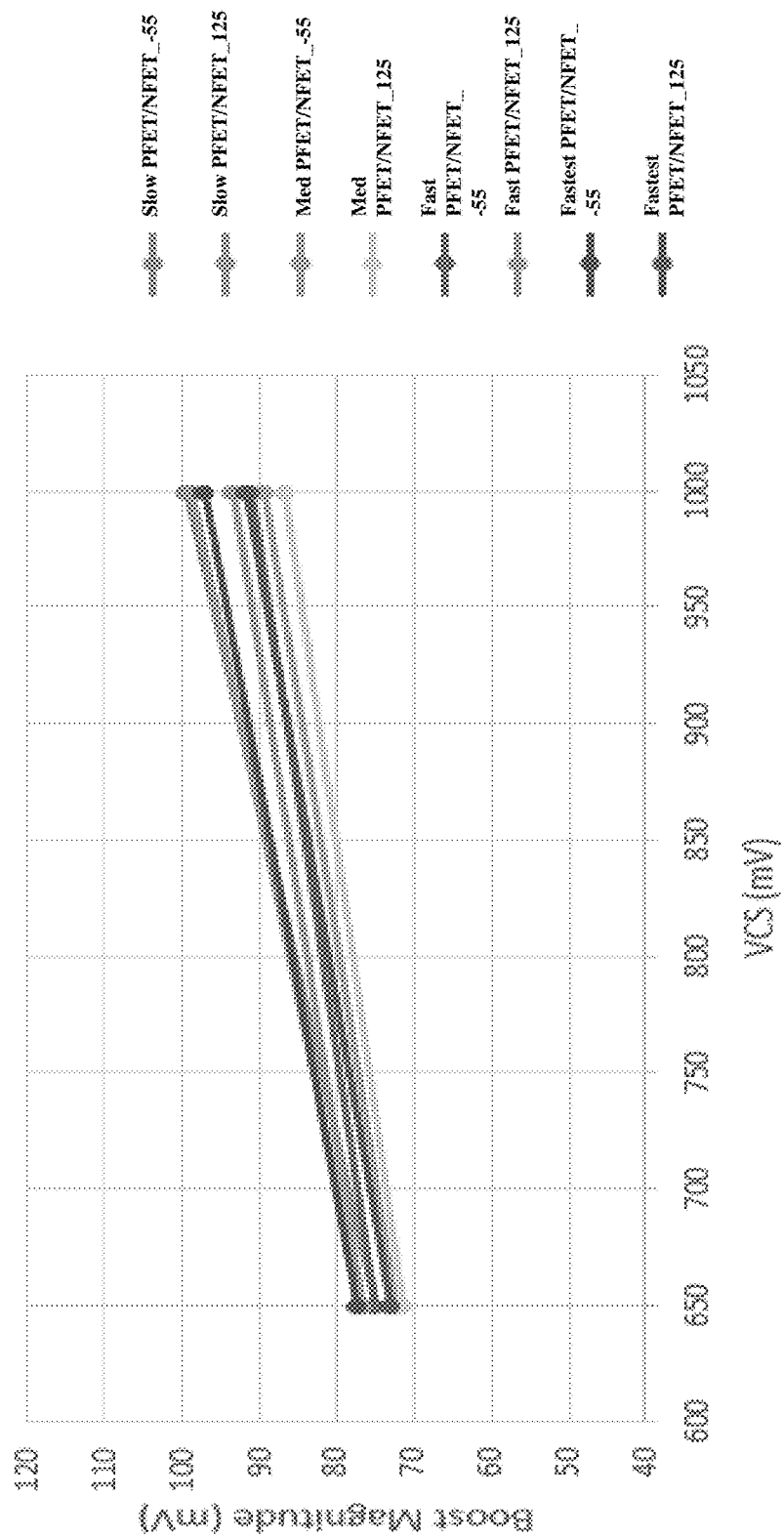
FIG. 5 shows a graph of a boost magnitude across process, voltage, and temperature (PVT) in accordance with aspects of the invention.

FIG. 5 shows a graph of a boost magnitude across process, voltage, and temperature (PVT) in accordance with aspects of the invention. FIG. 5 shows several different configurations of manufacturing processes (i.e., transistor configurations), voltages, and temperatures. For example, as shown in FIG. 5, the straight line slow_−55 is a configuration in which the NFET and PFET transistors in FIG. 1 have a slow switching time and are operated under a −55 degrees Celsius temperature. Further, as shown in FIG. 5, the straight line slow_125 is a configuration in which the n-type field effect transistor (NFET) and p-type field effect transistor (PFET) transistors in FIG. 1 have a slow switching time and are operated at +125 degrees Celsius temperature. As can thus be seen in FIG. 5, using the SRAM write assist circuit in FIG. 1, the boost magnitude is relatively constant across a wide range of temperatures.

FIG. 5 also shows different temperatures for a medium switching time (e.g., med_−55 and med_125), a fast switching time (e.g., fast_−55 and fast_125), and the fastest switching time (e.g., fastest_−55 and fastest_125). For all of these different straight lines, the boost magnitude remains relatively constant. In the SRAM write assist circuit shown in FIG. 1. For example, in FIG. 5, for a change of 350 mV in VCS, the boost magnitude varies less than 30 mV.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A write assist circuit, comprising:
    a boost capacitor with a first node coupled to a boost signal and a second node connected to a field effect transistor (FET) diode stack;
    a plurality of boost enabled transistors which each contain a gate connected to a boost control signal; and
    a controlled current source coupled between a ground signal and the second node of the boost capacitor,
    wherein the boost capacitor has a discharge path which is controlled to provide a boost voltage which is invariant to a level of a power supply signal.

2. The write assist circuit of claim 1, wherein the boost capacitor has a charging path to the power supply signal.

3. The write assist circuit of claim 1, wherein the discharge path comprises the plurality of boost enabled transistors and a plurality of write mask transistors to allow selection of the boost signal to be boosted.

4. The write assist circuit of claim 1, wherein the FET diode stack comprises:
    a first n-type FET (NFET) transistor with a drain connected to the power supply signal, a gate connected to the power supply signal, and a source connected to a drain of a second NFET transistor;
    the second NFET transistor with the drain of the second NFET transistor connected to the source of the first NFET transistor, a gate connected to the power supply signal, and a source connected to the second node of the boost capacitor.

5. The write assist circuit of claim 1, wherein the controlled current source is part of a current mirror.

6. The write assist circuit of claim 5, wherein the current mirror comprises a plurality of reference diodes which can be enabled or disabled by a digital control to adjust a controlled current level of the controlled current source.

7. The write assist circuit of claim 1, wherein the write assist circuit is a static random access memory (SRAM) write assist circuit.

8. The write assist circuit of claim 1, wherein the boost capacitor is an NFET transistor.

9. The write assist circuit of claim 1, wherein discharge of the second node of the boost capacitor is limited to an FET threshold plus overdrive.

* * * * *